United States Patent

Schulz et al.

[15] 3,684,933

[45] Aug. 15, 1972

[54] SEMICONDUCTOR DEVICE SHOWING AT LEAST THREE SUCCESSIVE ZONES OF ALTERNATE OPPOSITE CONDUCTIVITY TYPE

[72] Inventors: Egon Schulz; Ulrich Dolega; Johann Lang, all of Freiburg, Germany

[73] Assignee: International Telephone and Telegraph Corporation, Nutley, N.J.

[22] Filed: June 21, 1971

[21] Appl. No.: 155,289

Related U.S. Application Data

[63] Continuation of Ser. No. 858,624, Sept. 17, 1969, abandoned.

[52] U.S. Cl. ........317/235 R, 317/235 D, 317/235 Y, 317/235 Z, 307/303

[51] Int. Cl. ..........................H011 11/00, H011 15/00

[58] Field of Search.........317/22, 22.1, 22.11, 40.12, 317/40.13, 41.1; 307/303, 305

[56] References Cited

UNITED STATES PATENTS

| | | | |
|---|---|---|---|
| 3,177,414 | 4/1965 | Kurosawa et al. | 317/235 |
| 3,243,669 | 3/1966 | Sah | 317/235 |
| 3,312,882 | 4/1967 | Pollock | 317/235 |
| 3,416,049 | 12/1968 | Bohn et al. | 317/235 |
| 3,427,511 | 2/1969 | Rosenzweig | 317/235 |
| 3,432,920 | 3/1969 | Rosenzweig | 317/235 |
| 3,452,206 | 6/1969 | Biet et al. | 317/235 |
| 3,479,524 | 11/1969 | Lawless | 317/235 |
| 3,500,140 | 3/1970 | Makimoto et al. | 317/235 |

FOREIGN PATENTS OR APPLICATIONS

| | | | |
|---|---|---|---|
| 22,736 | 11/1965 | Japan | 317/235 |

*Primary Examiner*—John W. Huckert
*Assistant Examiner*—Andrew J. James

[57] ABSTRACT

An annular region is inserted into the base region of a transistor, this region being of opposite conductivity type to said base region and surrounds the emitter region. When a reverse biasing potential is applied to the annular region and the emitter base junction is forward biased, the annular region serves as a channel stopper or interrupter to induced channels which would otherwise form at the surface of the base region and extend between the collector base and emitter base PN junctions.

3 Claims, 10 Drawing Figures

INVENTORS
EGON SCHULZ
ULRICH DOLEGA
JOHANN LANG

BY

ATTORNEY

INVENTORS
EGON SCHULZ
ULRICH DOLEGA
JOHANN LANG

BY

ATTORNEY

INVENTORS
EGON SCHULZ
ULRICH DOLEGA
JOHANN LANG

BY

ATTORNEY

INVENTORS
EGON SCHULZ
ULRICH DOLEGA
JOHANN LANG

BY

ATTORNEY

SEMICONDUCTOR DEVICE SHOWING AT LEAST THREE SUCCESSIVE ZONES OF ALTERNATE OPPOSITE CONDUCTIVITY TYPE

This is a continuation of Ser. No. 858,624, filed Sept. 17, 1969, now abandoned.

BACKGROUND OF THE INVENTION

This invention relates to a semiconductor device having at least three successive zones of alternate opposite conductivity type.

From the U.S. Pat. Nos. 3,309,245; 3,309,246 and 3,338,758 it is known to interrupt the induced surface conducting channels (so-called channels) bridging the base zones of planar transistors, by means of highly doped annular zones in the portions of the base zones which are near the surface. These so-called channels, above all, appear in high-resistive p- conducting base zones of planar transistors and are due to an inversion of the conductivity type on account of surface effects. For this reason, within these portions near the surface, of relatively high-resistive base zones, there have already been inserted very highly doped annular zones of the same conductivity type as said base zone, which serve to interrupt these so-called channels, because the high doping of the ring or annular zones prevents the conductivity type from inversion. One condition for the effectiveness of the annular zones, however, is that their doping is high enough for preventing a so-called channel from originating.

Experiments have shown that, under certain circumstances, an induced channel is not cleared by such an annular zone and appears at the surface of the base region extending from the emitter junction to the collector junction. This is specifically the case when the collector-base junction is operated in the reverse direction and the emitter-base junction of a planar transistor is operated in the forward direction. Its effect, however, is completely nullified when both the collector-base and the emitter-base junction are operated in the reverse direction.

From both the German petty Patent No. 1,905,127 and the U.S. Pat. No. 3,335,296, it is already known to insert an annular zone into a more highly resistive zone of the opposite conductivity type, and to connect it with another electrode via an impedance. In these conventional types of devices, however, it is not intended to interrupt or to stop the channels but by a superficial division or distribution to several pn-junctions it is intended to increase the maximum blocking potential. In these conventional types of semiconductor devices the annular zone does not enclose the pn-junction which is operated in the forward direction.

SUMMARY OF THE INVENTION

It is an object of this invention to provide a semiconductor device having improved electrical characteristics.

It is a further object to provide for a semiconductor device which interrupts or reduces induced surface channels.

According to a broad aspect of this invention there is provided a semiconductor device having at least three successive zones of alternate opposite conductivity type forming two pn-junctions, of which one is operated in the forward direction, and the other is operated in the reverse direction, comprising an annular zone inserted superficially into the middle zone, and having a conductivity type which is in opposition to that of the middle zone.

A further aspect of this invention provides that said two pn-junctions extend to one surface side of the semiconductor body of the semiconductor device, said annular zone surrounds the pn-junction which being operated in the forward direction at a distance greater than its depletion layer, and said annular zone is electrically connected to either of the zones other than said middle zone, a blocking potential being applied to said annular zone which is lower than its breakdown voltage with respect to the middle zone so as to interrupt a surface induced channel.

Another aspect of this invention provides that the induced channel can be more effectively interrupted by the annular zone of the opposite conductivity type with respect to the base zone, when the pn-junction thereof is biased with respect to the base zone in the reverse direction.

In the preferred types of embodiments of the invention the blocking potential of the annular zone, with respect to the adjacent zone, is obtained by connecting this annular zone in series with further pn-junctions which are arranged in the zone that is operated in the reverse direction, and which is not adjacent to the annular zone. In integrated circuits there still result further possibilities for obtaining the necessary blocking potential of the annular zone, as is still to be explained hereinafter. Accordingly the invention is not restricted to semiconductor devices comprising merely one individual semiconductor component. In fact, as will be explained with reference to an example of embodiment, it is also suitable for being practically applied to integrated circuits. In integrated circuits there is a great number of possibilities for obtaining the blocking potential, or the blocking potentials of several annular zones of several semiconductor components of the integrated circuit. Out of these possibilities there is selected the most favorable one. Thus, for example, there may exist the possibility of connecting the annular zones of two semiconductor components in an integrated circuit, which may be acted upon by the required voltage via one or more pn-junctions.

DESCRIPTION OF THE PREFERRED EMBODIMENTS

Figure 1:
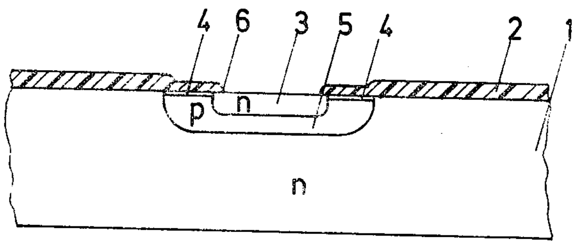
FIG. 1 shows a conventional type of planar transistor component comprising one induced surface conduction channel.
Figure 2:
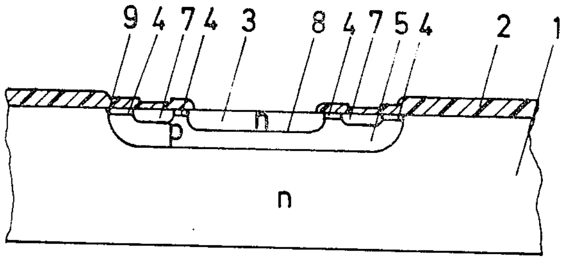
FIG. 2 shows a conventional type of solution for interrupting (stopping) a surface conduction channel.

The idea of solution for interrupting an induced surface conduction channel will now be explained with reference to an example of an npn-type planar transistor component according to FIG. 1 in which there exists the more frequently appearing case of an induced n-conductive surface conduction channel 4 (channel). As is well known, a planar transistor component is manufactured with the aid of the oxide masking technique in which, by utilizing the oxide layer 2 serving as a mask against a diffusion-in of dopings, there are successively diffused into an n-conductivity type semiconductor body, or into an n-conducting portion 1 of a semiconductor body, the p-conductivity type base zone 5 and, subsequently thereto, through an opening with the rim portion 6 in the oxide layer 2, there is diffused-in the n-conductivity type emitter zone 3. In so doing, there is often formed an n-conducting surface channel 4 which, as may be taken from FIG. 1, serves to connect the emitter zone 3 to the semiconductor body 1 which is active as the collector zone. The blocking ability or reverse voltage breakdown of the pn-junction between the base zone 5 and the portion of the semiconductor body 1 which is effective as the collector zone, is reduced, under certain circumstances, by the surface conduction channel 4, and this may be the cause of a considerably wastage. The n-conducting surface conduction channel 4, as shown in FIG. 1, as already mentioned hereinbefore, may be interrupted according to the showing of FIG. 2, by an annular zone 7, also referred to as a channel stopper. FIG. 2, just like FIG. 1, shows the cross-sectional view of an npn-type planar transistor component.

According to the invention, therefore, a pn-junction 8 of the emitter zone 3, which is operated in the forward direction, is surrounded by an annular zone 7 having a conductivity type which is in opposition to that of the adjoining base zone 5 (in the case of a planar transistor), said annular zone having any type of geometrical shape. The pn-junction of the annular zone 7, in addition thereto, with respect to the adjoining zone 5 (base zone) is applied to a blocking potential which must be less than the breakdown voltage of this particular pn-junction. Moreover, the distance of the annular zone 7 in relation to tee pn-junction 8 which is operated in the forward direction, throughout the entire course, must be greater than the space charge zone of the pn-junction of the annular zone 7 with respect to the reverse biasing blocking potential. This annular zone 7, by employing the generally known planar method, may be diffused together with the zone 3 (emitter zone) of the pn-junction 8 as operated in the forward direction. The production of the annular zone 7, therefore, does not require any additional steps of operation.

The positive biasing potential of the annular zone 7 which is necessary in the case of an npn-structure, is preferably obtained by connecting the annular zone in series with further pn-junctions.

Figure 3:
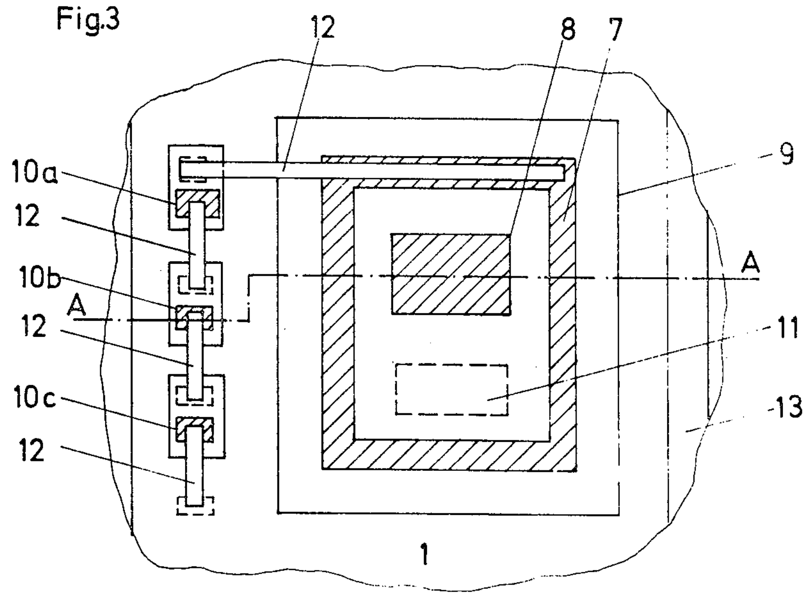
FIG. 3 shows one type of embodiment of the invention.
Figure 4:
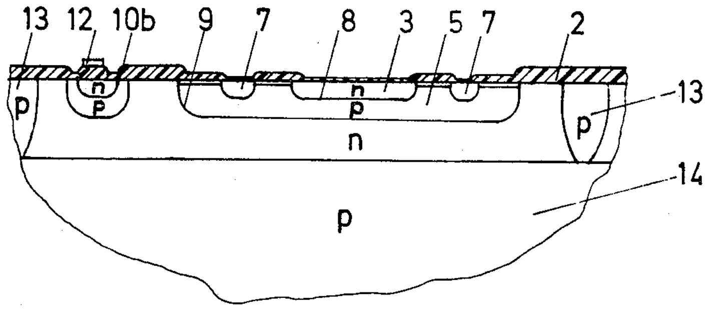
FIG. 4 shows a section taken on line A—A of FIG. 3.

In a first type of embodiment of the planar transistor component according to FIGS. 3 and 4, wherein FIG. 3 shows a plan view, and FIG. 4 shows a section taken on line A—A, the biasing potential of the annular zone 7 is obtained with the aid of further pn-junctions 10*a*, 10*b* and 10*c* of similar planar transistor components which, however, are reduced in size. Since these planar components may be manufactured simultaneously with the annular zone 7 and the zones 3 and 5, no additional steps of manufacturing are required for diffusing the zone 10*a*, 10*b* and 10*c*.

The series connection, or the application of the biasing potential respectively, is effected via lead-in conductors 12 which, preferably, extend partly as conductor leads on the oxide layer 2. Contacting is effected at the surface portions which are encircled by the dashlines, and which may be highly doped surface areas of the zones to be contacted. Contacting of the base zone is effected at 11. As is illustrated in FIG. 3, the last zone of the series arrangement of said pn-junctions, is connected to the collector zone 1 of the planar transistor. Zones 13 indicate that the planar transistor component may be regarded as belonging to a monolithic integrated circuit whose components, as the present planar transistor component, are separated from one another with respect to DC by the isolating zones 13 surrounding the components, and which, as is well known, extend through an epitaxial layer as deposited on a semiconductor base body 14 having a conductivity type which is in opposition thereto.

Figure 5:
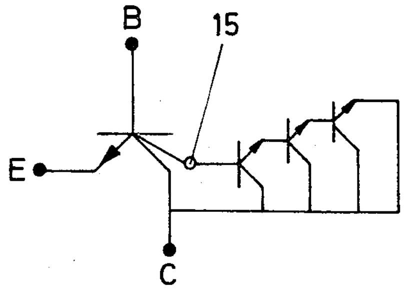
FIG. 5 shows the equivalent circuit diagram of the inventive type of embodiment according to FIGS. 3 and 4.

FIG. 5 shows the equivalent circuit diagram of the planar transistor component according to FIGS. 3 and 4. In this illustration the ring zone 7 is symbolically indicated by a small circle 15 which, as may be taken from FIG. 5, is acted upon by a blocking potential.

Figure 6:
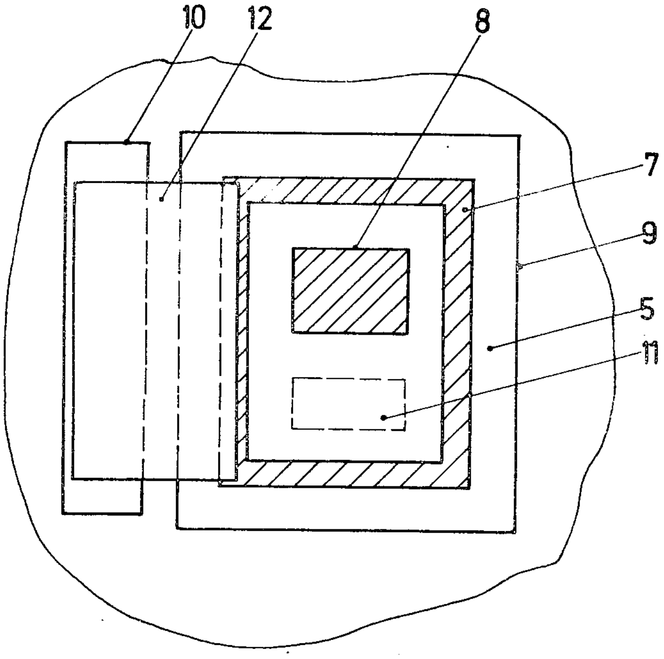
FIG. 6 shows a further type of embodiment of the invention.
Figure 7:
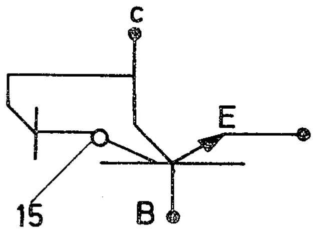
FIG. 7 shows the equivalent circuit diagram of the inventive type of embodiment according to FIG. 6.

In a second type of embodiment according to FIG. 6, whose equivalent circuit diagram is shown in FIG. 7, the biasing potential which is required for the annular zone 7, is obtained by a series connection of the annular zone 7 with a pn-junction 10 corresponding to a collector-base junction. Otherwise the planar transistor component according to FIG. 6, corresponds to the planar transistor component as shown in FIGS. 3 and 4.

Figure 8:
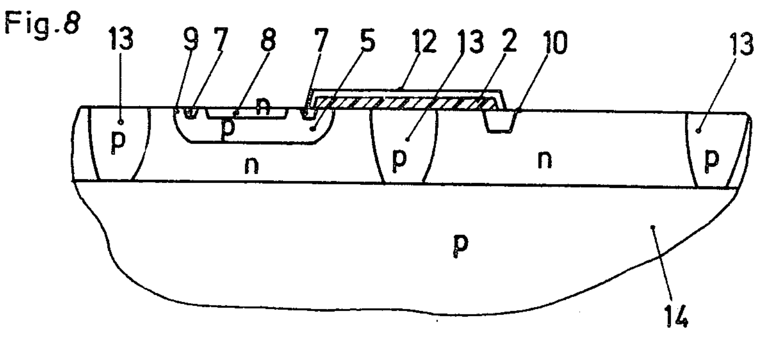
FIGS. 8 and 9 show further embodiments of the invention.

In the case of integrated circuits the necessary blocking potential of the annular zone 7 may also be tapped or taken off at the pn-junction 10 of another semiconductor component forming part of the integrated circuit, with the components thereof being separated from one another with respect to direct current, by the isolating zones 13. Such a further type of embodiment is illustrated in FIG. 8. The annular zone 7, according to FIG. 8, is connected via a lead-in conductor 12, to the zone of the other semiconductor component of the respective integrated circuit, at the pn-junction 10 thereof there is effected a dropping of the necessary blocking potential. The separation of the semiconductor components with respect to direct current, is effected usually by means of isolating zones 13 extending through an epitaxial layer arranged on a substrate 14 of a conductivity type which is in opposition thereto.

Figure 9:
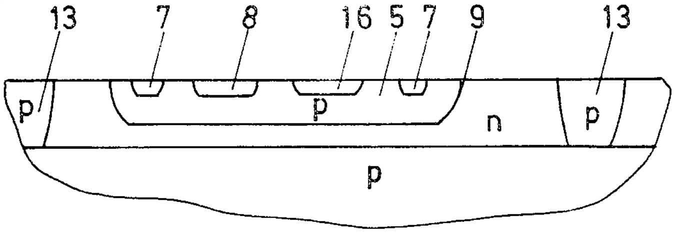

In another type of embodiment according to FIG. 9, the annular zone 7 does not only surround a zone showing a pn-junction 8 which is operated in the forward direction, but still a further zone having a pn-junction 16 which may be operated in the reverse direction.

Figure 10:
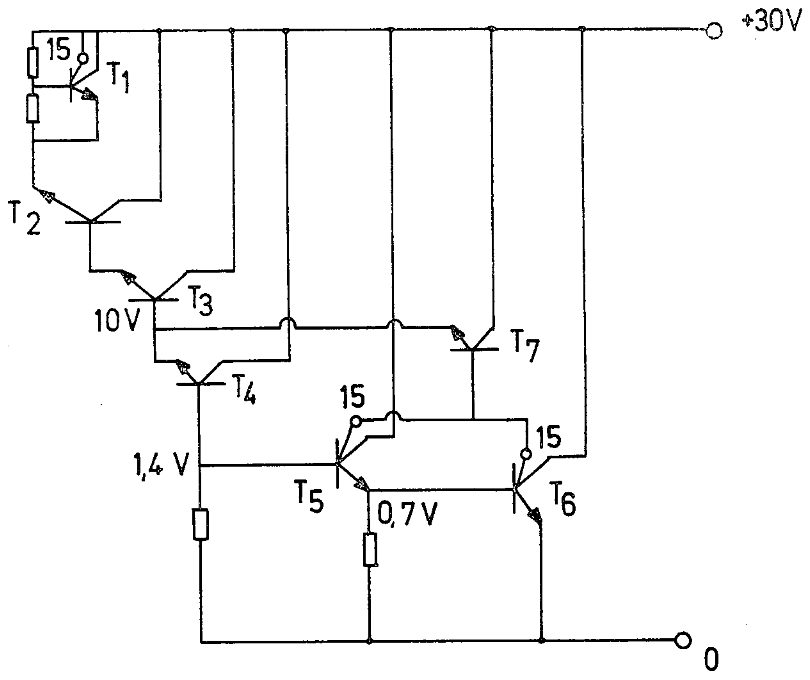
FIG. 10 shows the equivalent circuit diagram relating to a practical application of the invention within a monolithic integrated circuit.

FIG. 10 shows the equivalent circuit diagram relating to a monolithic integrated circuit comprising two terminals, and which is used as a temperature-compensated zener diode, hence as a two-terminal network. This illustrates the different ways it is possible to attain the necessary reverse biasing blocking potentials for the three annular zones 15 of the transistors $T_1$, $T_5$, and $T_6$. While in the transistor $I_1$ the annular zone indicated by the reference numeral 15, is directly connected to the collector zone, the voltage supply of the annular zones of the transistors $T_5$ and $T_6$ are effected in common via a specially provided transistor structure $T_7$ comprising the connecting means shown in FIG. 10. Potential conditions, as far as being of interest, will result from the plotted voltage values.

We claim:

1. A semiconductor device having at least a first, second and third successive region of alternate opposite conductivity type forming a first pn-junction between said first and second regions and a second pn-junction between said second and third regions, an annular region inserted within said second region between said first and second pn-junctions, said annular region being of opposite conductivity type to said second region and forms a third pn-junction between said annular region and said second region, comprising:

a fourth region formed within said third region, said fourth region being of opposite conductivity type to said third region, said fourth region forming a fourth pn-junction with said third region; and electrode means for electrically connecting said fourth region directly to said annular region so that when a reverse biasing potential is applied to said third region, said third and fourth pn-junctions are connected in series and said second, third and fourth pn-junctions are reversed biased, whereby the potential drop across said third pn-junctiȯn is less than the potential drop across said second pn-junction.

2. A semiconductor device according to claim 1 wherein said first region is formed within said second region, said second region being formed within said third region, said first and second pn-junctions extending toward one surface of said device, and said annular region completely surrounding said first region.

3. A semiconductor device according to claim 1 wherein said first region is the emitter of a transistor.

* * * * *